(12) United States Patent
Onodera

(10) Patent No.: US 7,278,075 B2
(45) Date of Patent: Oct. 2, 2007

(54) SCAN PATH CIRCUIT HAVING A SELECTION CIRCUIT FOR DELIVERING AN INPUT SIGNAL TO SELECTED SCAN CHAIN CIRCUITS

(75) Inventor: Takeshi Onodera, Kanagawa (JP)

(73) Assignee: Sony Corporation (JP)

( * ) Notice: Subject to any disclaimer, the term of this patent is extended or adjusted under 35 U.S.C. 154(b) by 1289 days.

(21) Appl. No.: 10/265,613

(22) Filed: Oct. 8, 2002

(65) Prior Publication Data

US 2003/0106002 A1    Jun. 5, 2003

(30) Foreign Application Priority Data

Oct. 9, 2001    (JP)    ............................ P2001-311181

(51) Int. Cl.
*G01R 31/28* (2006.01)
(52) U.S. Cl. ...................................... 714/726; 714/738
(58) Field of Classification Search ................ 714/724, 714/726, 729, 727, 738
See application file for complete search history.

(56) References Cited

U.S. PATENT DOCUMENTS 6,158,032 A * 12/2000 Currier et al. .............. 714/726

| | | | |
|---|---|---|---|
| 6,671,838 B1 * | 12/2003 | Koprowski et al. | 714/726 |
| 6,715,105 B1 * | 3/2004 | Rearick | 714/30 |
| 6,795,944 B2 * | 9/2004 | Barnhart | 714/726 |
| 6,829,740 B2 * | 12/2004 | Rajski et al. | 714/729 |

* cited by examiner

*Primary Examiner*—Guy Lamarre
*Assistant Examiner*—Esaw T. Abraham
(74) *Attorney, Agent, or Firm*—Rader Fishman & Grauer PLLC; Ronald P. Kananen

(57) ABSTRACT

A scan path circuit having a plurality of scan chain circuits includes a data compression circuit for data-compressing the outputs of the scan chain circuits and delivering the compressed outputs, and a selection circuit for switching the inputs of the scan chain circuits. The selection circuit switches an operation mode selectively in accordance with a predetermined control signal in such a manner that, in a first operation mode, an input signal obtained from a predetermined input terminal is delivered to the first and second scan chain circuits, and in a second operation mode, the input signal is delivered to the first and third scan chain circuits. Accordingly, the logic circuit can be tested with certainty in a short required time by the simplified structure.

7 Claims, 5 Drawing Sheets

FIG. 2

| COMMON GROUP | FIRST GROUPING CONTACT B | SECOND GROUPING CONTACT C | SCAN-IN TERMINAL |
|---|---|---|---|
| 0 | ( 0, 1, 2, 3) | ( 0, 4, 8, 12) | SI[0] |
| 1 | ( 4, 5, 6, 7) | ( 1, 5, 9, 13) | SI[5] |
| 2 | ( 8, 9, 10, 11) | ( 2, 6, 10, 14) | SI[10] |
| 3 | (12, 13, 14, 15) | ( 3, 7, 11, 15) | SI[15] |
| 4 | (16, 17, 18, 19) | (16, 20, 24, 28) | SI[16] |
| 5 | (20, 21, 22, 23) | (17, 21, 25, 29) | SI[21] |
| 6 | (24, 25, 26, 27) | (18, 22, 26, 30) | SI[26] |
| 7 | (28, 29, 30, 31) | (19, 23, 27, 31) | SI[31] |

FIG. 3

| NUMBER OF SCAN-IN | 4 | 2 | 1 |
|---|---|---|---|
| NUMBER OF SCAN-OUT | 4 | 4 | 4 |
| NUMBER OF FAULTS | 586054 | 586054 | 585978 |
| NUMBER OF DETECTED FAULTS | 576014 | 576028 | 576021 |
| FAULT DETECTION RATE | 98.29 | 98.29 | 98.3 |
| NUMBER OF PATTERNS | 847 | 1031 | 1020 |
| SCAN MEMORY CAPACITY | 2595*847*(4+4) | 2595*1031*(2+4) | 2595*1020*(1+4) |
| PATTERN COMPRESSION RATE | 1 | 0.91 | 0.75 |

SCAN PATH CIRCUIT HAVING A SELECTION CIRCUIT FOR DELIVERING AN INPUT SIGNAL TO SELECTED SCAN CHAIN CIRCUITS

BACKGROUND OF THE INVENTION

The present invention relates to a scan path circuit, an integrated circuit (IC) and an IC checking method, and, more particularly, to those adapted for a large-scale integrated logic circuit. In the present invention, a plurality of scan chain circuits are so connected that input terminals are usable in common, and the common connection is switched to perform an exact test in a short required time by a simplified structure.

With regard to the conventional scan path circuit, a variety of methods have been proposed heretofore for preventing an increase of equipment and a test time caused due to an increase of scan test patterns derived from the enlargement of the logic circuit scale.

More specifically, a scan path circuit is such that a predetermined logic value is set with respect to a logic circuit to be checked, and its response is outputted to an external device. The scan path circuit is formed integrally with the logic circuit to be checked, thereby constituting an integrated circuit. If the scale of the logic circuit to be checked is enlarged, it is unavoidable that the quantity of test patterns also is increased, consequently, prolonging the test time required for each integrated circuit. In case the test time is rendered longer, it becomes necessary to increase the number of testers for ensuring the required number of measurement chips per unit time, hence increasing the equipment correspondingly thereto. And, since such test patters are recorded and held in the memories of testers, the memory capacity needs to be increased in proportion to an increase of the test patterns, thereby causing an increase of the burden to the equipment.

It may be possible to double the number of scan chains by dividing the subject to be checked into a plurality of blocks and setting logic values in parallel simultaneously, and to shorten the required test time by setting scan test patterns in parallel simultaneously. However, this structure increases the number of input terminals for the test patterns and also increases the number of output terminals for the responses, whereby some limits are inevitable practically. And, depending on the kind of testers, the maximum number of handleable scan chains is restricted to 8 through 32 or so, consequently, bringing about limits in increasing the number of scan chains.

As one of the methods proposed for preventing such an increase of the equipment and the test time, a Logic BIST (Built-In Self-Test) system is currently in practical use. According to the Logic BIST system, a scan-in pattern generation circuit for generating test patterns and a scan-out result compression circuit for data-compressing and outputting the responses are formed into an integrated circuit. The scan-in pattern generation circuit consists of, for example, a dummy random pattern generation circuit.

In this system, a logic circuit can be tested merely by supplying clock pulses a predetermined number of times, whereby the tester structure can be simplified correspondingly thereto. Further, it is possible to prevent an increase in the number of terminals while increasing the number of scan chains in the integrated circuit, hence reducing the required test time.

As another method, there is proposed an OP-MISR system which incorporates merely a pattern compressor (MISR: Multiple Input Signature Register) employed in the Logic BIST system. In this OP-MISR system, scan test patterns are inputted from an external device to ensure thereby a high fault detection rate. And, due to data compression of the responses, the tester can be simplified structurally with a reduction of the memory capacity used for the scan-out processing. Further, in the integrated circuit, the number of response output terminals is reduced, and the reduced number of output terminals can be utilized as input terminals for scan test patterns, thereby increasing the number of the scan chains and, consequently, shortening the required test time.

As a further method, there is proposed a Smart BIST system where a decoder for outputting the scan test patterns held after data compression is incorporated instead of the dummy random pattern generator employed in the Logic BIST system. According to this Smart BIST system, the number of scan chains is not limited by the number of terminals, so that the test time can be shortened, and the tester can be structurally simplified by holding the scan test patterns on the integrated circuit side.

In the Logic BIST system, since the scan test patterns are dummy random patterns, there exists a problem that its fault detection rate is lower than the rate in using the conventional scan test patterns.

One method for solving the above problem is proposed in regard to the Logic BIST system. According to this method, a test point is provided in a portion of the logic circuit that is difficult to be tested, and a logic value is set via such a test point or a response is observed therethrough. However, it is reported that, in this method also, a practically sufficient effect has not yet been achieved (ITC INTERNATIONAL TEST CONFERENCE Paper 14.2, pp. 358-367, 1999, "Logic BIST for Large Industrial Designs Real Issues and Case Studies").

Meanwhile, in the OP-MISR system, a high fault detection rate can be ensured by inputting scan test patterns from an external device; and, the required test time can be shortened by increasing the number of scan chains by utilization of the terminals of the integrated circuit as input terminals for scan test patterns correspondingly to the reduction of the number of response output terminals. However, it is eventually necessary to provide scan test pattern input terminals equal in number to the scan chains, hence causing restrictions in the method of increasing the number of scan chains.

Further, in the Smart BIST system, although the above problems can be solved, the decoder is structurally complicated as the scan test patterns obtained through data compression and held thereafter are decoded by the decoder, so that the integrated circuit is rendered structurally intricate due to the enlargement of the circuit scale and the increase of the chip area.

SUMMARY OF THE INVENTION

The present invention has been accomplished in view of the problems mentioned above. And, it is an object of the invention to provide a scan path circuit, an integrated circuit (IC), and an IC checking method capable of performing an exact test in a short required time by a simplified structure.

According to a first aspect of the present invention, there is provided a scan path circuit wherein a selection circuit switches an operation mode selectively in accordance with a predetermined control signal. In a first operation mode, an input signal obtained from a predetermined input terminal is delivered to first and second scan chain circuits. And, in a second operation mode, the input signal is delivered to the first and third scan chain circuits.

According to a second aspect of the present invention, there is provided a scan path circuit wherein a selection circuit switches an operation mode selectively in accordance with a predetermined control signal. In a first operation mode, input terminals are connected respectively to scan chain circuits of each group in such a manner that the input terminals are used in common in the scan chain circuits of each of the groups formed by a first grouping. And, in a second operation mode, the input terminals are connected respectively to the scan chain circuits of each group in such a manner that the input terminals are used in common in the scan chain circuits of each of the groups formed by a second grouping. The plurality of scan chain circuits is so set that those circuits belonging to the same group formed by the first grouping belong to a different group formed by the second grouping.

According to a third aspect of the present invention, there is provided an integrated circuit wherein a selection circuit switches an operation mode selectively in accordance with a predetermined control signal. In a first operation mode, an input signal obtained from a predetermined input terminal is delivered to first and second scan chain circuits. And, in a second operation mode, the input signal is delivered to the first and third scan chain circuits.

According to a fourth aspect of the present invention, there is provided an integrated circuit wherein a selection circuit switches an operation mode selectively in accordance with a predetermined control signal. In a first operation mode, input terminals are connected respectively to scan chain circuits of each group in such a manner that the input terminals are used in common in the scan chain circuits of each of the groups formed by a first grouping. And, in a second operation mode, the input terminals are connected respectively to the scan chain circuits of each group in such a manner that the input terminals are used in common in the scan chain circuits of each of the groups formed by a second grouping. The plurality of scan chain circuits is so set that those belonging to the same group formed by the first grouping circuits belong to a different group formed by the second grouping.

According to a fifth aspect of the present invention, there is provided an integrated circuit checking method wherein an operation mode is selectively switched by means of a selection circuit to switch thereby an input to a plurality of scan chain circuits. In a first operation mode, an input signal obtained from a predetermined input terminal is delivered to first and second scan chain circuits. And, in a second operation mode, the input signal is delivered to the first and third scan chain circuits.

And, according to a sixth aspect of the present invention, there is provided a method of checking an integrated circuit having a plurality of scan chain circuits, wherein an operation mode is selectively switched by means of an selection circuit to switch thereby an input to the plural scan chain circuits, and the scan chain circuits are so set that those belonging to the same group formed by the first grouping belong to a different group formed by the second grouping. In a first operation mode, input terminals are connected respectively to scan chain circuits of each group in such a manner that the input terminals are used in common in the scan chain circuits of each of the groups formed by the first grouping. And, in a second operation mode, the input terminals are connected respectively to the scan chain circuits of each group in such a manner that the input terminals are used in common in the scan chain circuits of each of the groups formed by the second grouping.

In the structure of the first aspect applied to a scan path circuit, a selection circuit switches an operation mode selectively in accordance with a predetermined control signal. In a first operation mode, an input signal obtained from a predetermined input terminal is delivered to first and second scan chain circuits. And, in a second operation mode, the input signal is delivered to the first and third scan chain circuits. Therefore, in the first or second operation mode, the first and second scan chain circuits, or the first and third scan chain circuits, are driven simultaneously to confirm the operation, and the structure simplified correspondingly thereto ensures an exact confirmation of the operation in a short time. And, with regard to any region where confirmation of the operation is difficult even by driving the two scan chains in common, the first and second scan chain circuits are driven in common in the first operation mode, and the first and third scan chain circuits are driven in common in the second operation mode, so that the operation can be confirmed in either operation mode, consequently, achieving enhanced confirmation of the operation with certainty. Thus, it becomes possible to test the logic circuit exactly in a short required time by the simplified structure.

In the structure of the second aspect applied to a scan path circuit, a selection circuit switches an operation mode selectively in response to a predetermined control signal. In a first operation mode, input terminals are connected respectively to scan chain circuits of each group in such a manner that the input terminals are used in common in the scan chain circuits of each of the groups formed by a first grouping. And, in a second operation mode, the input terminals are connected respectively to the scan chain circuits of each group in such a manner that the input terminals are used in common in the scan chain circuits of each of the groups formed by a second grouping. The plural scan chain circuits are so set that those belonging to the same group formed by the first grouping belong to a different group formed by the second grouping. Therefore, in the first or second operation mode, the scan chain circuits are driven in common in each group to confirm the operation, and the structure simplified correspondingly thereto ensures exact confirmation of the operation in a short time. And, with regard to any region where confirmation of the operation is difficult even by driving the scan chains of each group in common, the operation can be confirmed in either of the first and second operation modes, since the scan chain circuits are so set that, in the first operation mode, the scan chain circuit belonging to the same group formed by the first grouping belong to a different group formed by the second grouping. Consequently, it becomes possible to achieve enhanced confirmation of the operation with certainty. And, due to such a simplified structure, the logic circuit can be tested exactly in a short required time.

Thus, in the structures of the third and fourth aspects applied to an integrated circuit, it is possible to test the logic circuit with certainty by the simplified structure in a short required time.

Further, in the structures of the fifth and sixth aspects applied to an integrated circuit checking method, it is possible to test the logic circuit with certainty by the simplified structure in a short required time.

Consequently, according to the present invention, the plurality of scan chain circuits are so connected that the input terminals are used in common, and the connection for common use is switched selectively to achieve an exact test of the logic circuit in a short required time by the simplified structure.

The above and other features and advantages of the present invention will become apparent from the following description, which will be given with reference to the accompanying illustrative drawings.

BRIEF DESCRIPTION OF THE DRAWINGS

FIG. 2 is a table for explaining a selector in the scan path circuit of FIG. 1;

FIG. 3 is another table for explaining the operation of the scan path circuit shown in FIG. 1;

DESCRIPTION OF THE PREFERRED EMBODIMENTS

Hereinafter, some preferred embodiments of the invention will be described in detail with reference to the accompanying drawings.

(1) First Embodiment

(1-1) Structure of First Embodiment

Figure 1:
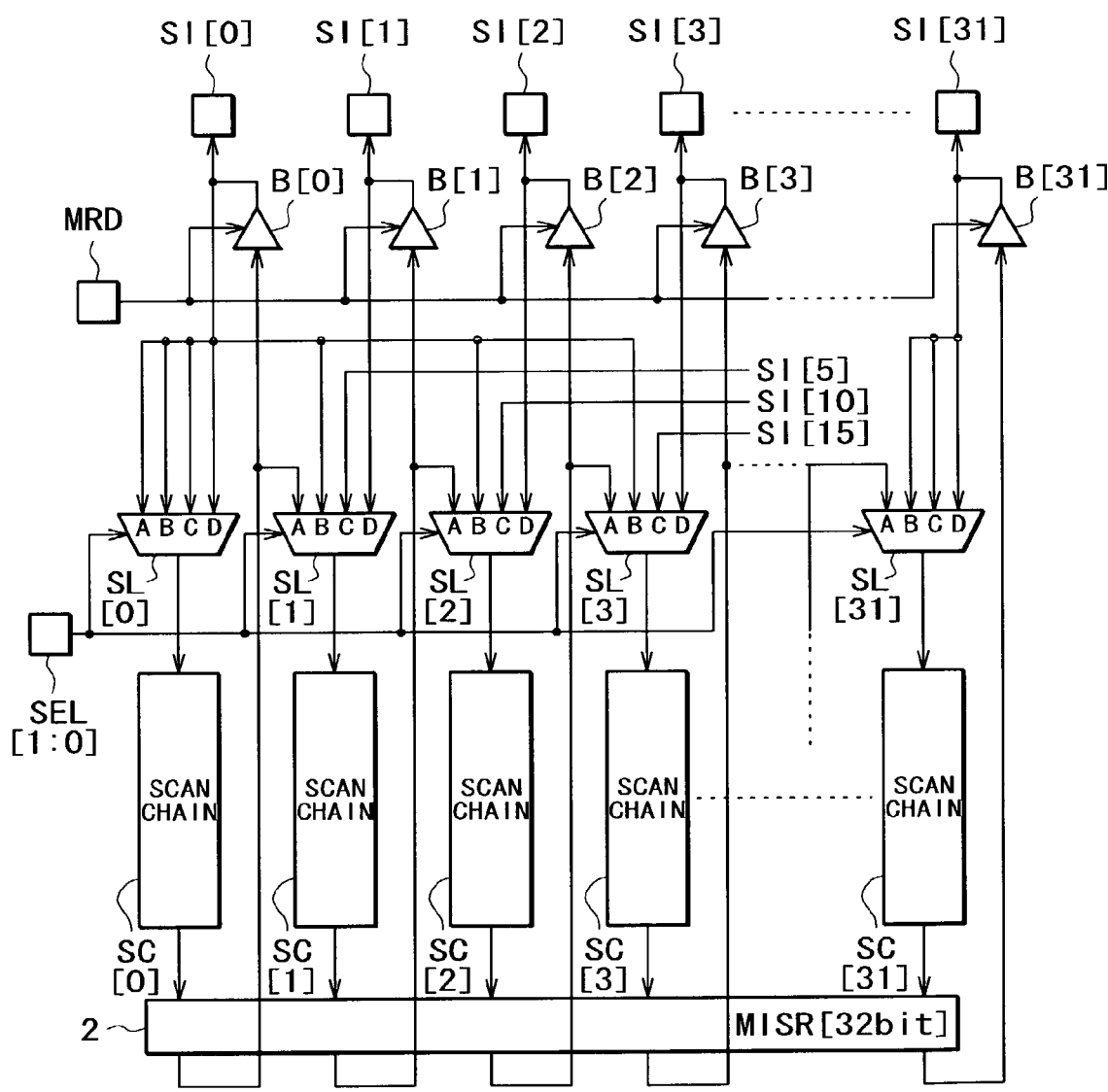
FIG. 1 is a connection diagram of a scan path circuit represented by a first embodiment of the present invention.

FIG. 1 is a connection diagram showing the structure of a scan path circuit applied to an integrated circuit represented by the first embodiment of the invention.

This integrated circuit constitutes a large scale logic circuit that can be checked by setting logic values by means of the scan path circuit 1 and confirming the responses therefrom.

This integrated circuit comprises 32 input/output terminals SI[0]-SI[31] as scan-in terminals for inputting predetermined test patterns respectively to the scan path circuit 1 and outputting the responses obtained therefrom, a control signal input terminal MRD for controlling each input and output of the input/output terminals SI[0]-SI[31], and a control signal input terminal SEL[1:0] for controlling a scan mode.

The scan path circuit 1 has 32 scan chain circuits SC[0]-SC[31] corresponding relatively to the 32 input/output terminals SI[0]-SI[31], wherein scan patterns can be inputted to the 32 scan chain circuits SC[0]-SC[31] respectively via selectors SL[0]-SL[31]. The outputs of the 32 scan chain circuits SC[0]-SC[31] are delivered to a multiple input signature register (MISR) 2, and the output of this multiple input signature register 2 can be outputted from the input/output terminals SI[0]-SI[31] via buffer circuits B[0]-B[31].

The selectors SL[0]-SL[31] are so interlocked as to switch the contacts in accordance with a control signal supplied thereto via the input terminal SEL[1:0]. To the first contact denoted by reference symbol A, a scan pattern obtained from the first input/output terminal SI[0] is delivered in the selector SL[0] of the first stage, and output data from the preceding scan chain circuits SC[0]-SC[30] are delivered respectively via the multiple input signature register (MISR) 2 in the selectors SL[1]-SL[31] of the following stages. Consequently, in the scan path circuit 1, the first contacts A are selected in accordance with the control signal, and in a state where the 32 scan chain circuits SC[0]-SC[31] are connected in series, the test pattern can be delivered via the first input/output terminal SI[0], so that the entire responses can be outputted from the 32nd input/output terminal SI[32] via the multiple input signature register (MISR) 2.

Regarding the second contacts denoted by reference symbol B, the selectors SL[0]-SL[31] group the scan chain circuits SC[0]-SC[31] four by four sequentially from the first-stage scan chain circuit SC[0] in such a manner that the first input/output terminal SI[0] is connected in common in the selectors SL[0]-SL[3] of the scan chain circuits SC[0]-SC[3] belonging to the first group. Then, the sixth input/output terminal SI[5] is connected in common in the selectors SL[4]-SL[7] of the scan chain circuits SC[4]-SC[7] belonging to the second group. Subsequently, the eleventh input/output terminal SI[10] is connected in common in the selectors SL[8]-SL[11] of the scan chain circuits SC[8]-SC[11] belonging to the next group. Thereafter, such connection is repeated successively with regard to each of the groups. FIG. 2 is a table showing the relationship of such connection, wherein numerals denoted by the first grouping correspond to the reference symbols of the scan chain circuits SC[0]-SC[31].

Thus, in the scan path circuit 1, contacts B are selected by setting a control signal so that, in each first group of the 32 scan chain circuits SC[0]-SC[31] formed four by four sequentially, scan-in terminals SI[0], SI[5], SI[10], SI[15] and so forth for inputting test patterns are used in common, wherein a common test pattern can be supplied to each of the groups formed by the first grouping.

Regarding the third contacts denoted by reference symbol C, the selectors SL[0]-SL[31] similarly group the 32 scan chain circuits SC[0]-SC[31] four by four to form second groups, wherein the scan-in terminals SI[0], SI[5], SI[10], SI[15] and so forth are connected for common use, so that a common test pattern can be supplied to each of the groups formed by the second grouping.

In the first grouping, as shown in FIG. 2, the scan chain circuits SC[0]-SC[31] are grouped four by four sequentially from the first-stage scan chain circuit SC[0]. Meanwhile, in the second grouping, the scan chain circuits SC[0]-SC[31] are selectively grouped four by four in succession from the first-stage scan chain circuit SC[0] in such a manner that any of the scan chain circuits SC[0]-SC[31] belonging to the same group formed by the first grouping belongs to a different group formed by the second grouping.

Regarding the fourth contacts denoted by reference symbol D, the selectors SL[0]-SL[31] select the input/output terminals SI[0]-SI[31] corresponding thereto respectively. Therefore, in the scan path circuit 1, the common contacts D are selected by setting the control signal so that test patters can be inputted to the scan chain circuits SC[0]-SC[31] respectively and in parallel simultaneously.

Consequently, at a product check during manufacture in a factory, a test pattern is supplied to the scan chain circuits SC[0]-SC[31] through selection of the contacts B in a predetermined operation mode, and after confirmation of the operation by monitoring the output signal of the MISR 2 at the input/output terminals SI[0]-SI[31], the test pattern is supplied to the scan chain circuits SC[0]-SC[31] through selection of the contacts C with a change of the operation mode. Subsequently, the operation is confirmed by monitoring the output signal of the MISR 2 at the input/output terminals SI[0]-SI[31], and thus, confirming the operation of the product is executed.

The scan path circuit 1 is usable for detailed analysis of any fault portion by first inputting a test pattern via the input/output terminal SI[0] with the selection of the contact A and then confirming the output signal of the scan chain circuit SC[31] obtained from the input/output terminal SI[31] through the MISR 2.

The multiple input signature register (MISR) 2 is so connected that the outputs of the scan chain circuits SC[0]-SC[31] can be delivered to the input/output terminals SI[0]-SI[31] respectively via buffer circuits B[0]-B[31], and then the buffer circuits B[0]-B[31] switch the operation interlockingly in accordance with a control signal supplied thereto via the input terminal MRD. The multiple input signature register 2 is further capable of performing data compression with regard to the outputs of the scan chain circuits SC[0]-SC[31] under control of an external device.

(1-2) Operation of First Embodiment

In the scan path circuit 1 having the structure mentioned above, at a product check to be executed prior to shipment from a factory, the contacts B of the selectors SL[0]-SL[31] are selected in accordance with a control signal inputted from the tester, whereby the first groups, which are formed by sequentially grouping the 32 scan chain circuits SC[0]-SC[31] four by four, are connected in common respectively to the scan-in terminals SI[0], SI[5], SI[10], SI[15] and so forth.

In this state of the scan path circuit 1, a scan pattern is inputted successively to the scan-in terminals SI[0], SI[5], SI[10], SI[15] and so forth connected in common, whereby the same scan pattern is inputted to each group. And, the respective responses of the scan chain circuits SC[0]-SC[31] are obtained, with switching of the operation of the buffer circuits B[0]-B[31], from the input/output terminals SI[0]-SI[31] via the multiple input signature register (MISR) 2.

Thus, in the scan path circuit 1, the operation is confirmed by the use of 8 scan-in terminals with regard to the 32 scan chain circuits SC[0]-SC[31], and, therefore, the logic circuit can be tested in a short required time by the structure simplified correspondingly thereto.

FIG. 3 shows the results of experiments conducted with the inputs of plural scan path circuits connected in common, as described. The experiments represent a first case where a predetermined test pattern is supplied respectively to four scan path circuits (number of scan-in=4), a second case where a predetermined test pattern is supplied respectively to two lines constituted by connecting two inputs of each scan path circuit in common (number of scan-in=2), and a third case where a predetermined test pattern is supplied to the entire inputs of four scan path circuits in common (number of scan-in=1).

According to the experimental results, it is seen that, even when one test pattern is supplied to the inputs of plural scan path circuits connected in common, the achievable fault-rate detection precision can be maintained substantially the same as the precision attained in another case where the test patterns are supplied independently by increasing the number of test patterns. This is derived from the fact that, even in the case where test patterns are supplied independently, there exists the status of many "don't cares" in the test patterns. Each of the cases shown in FIG. 3 represents the result obtained without using the OP-MISR system. If the OP-MISR system is used, the data compression rate with the number of scan-in being 2 or 1 is improved to 0.3 or 0.1, whereby a remarkably high data compression rate can be ensured to achieve efficient confirmation of the operation.

Thus, in the scan path circuit 1, an exact test can be performed with certainty in a short required time by the simplified structure.

Consequently, in the scan path circuit 1, it is possible to confirm the operation efficiently while attaining a remarkably high data compression rate. Also, the capacity of a memory incorporated in the tester can be reduced. Further, the tester has a simplified structure adapted to input a scan pattern via 8 terminals, hence, ensuring an exact confirmation of the operation.

Figure 4:
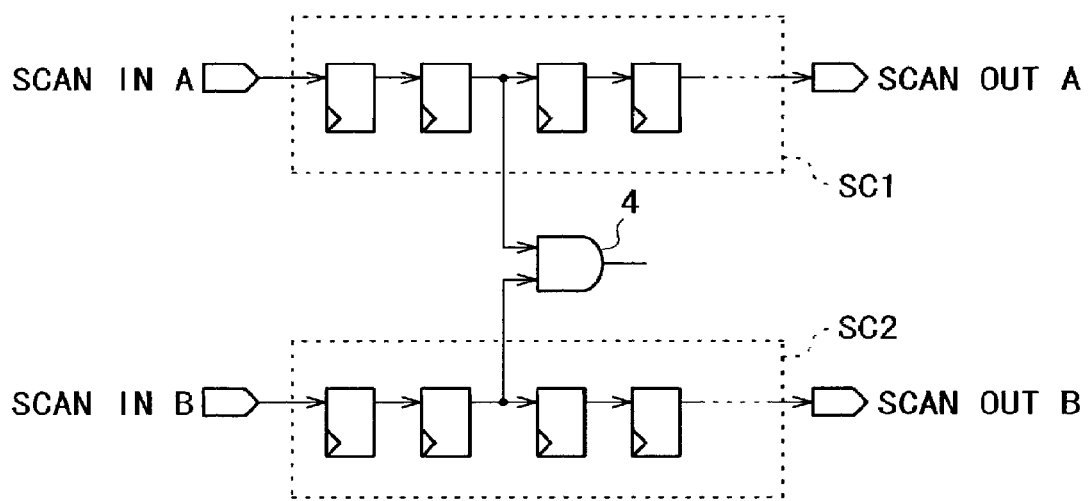
FIG. 4 is a connection diagram for explaining how a plurality of scan chain circuits are driven individually.
Figure 5:
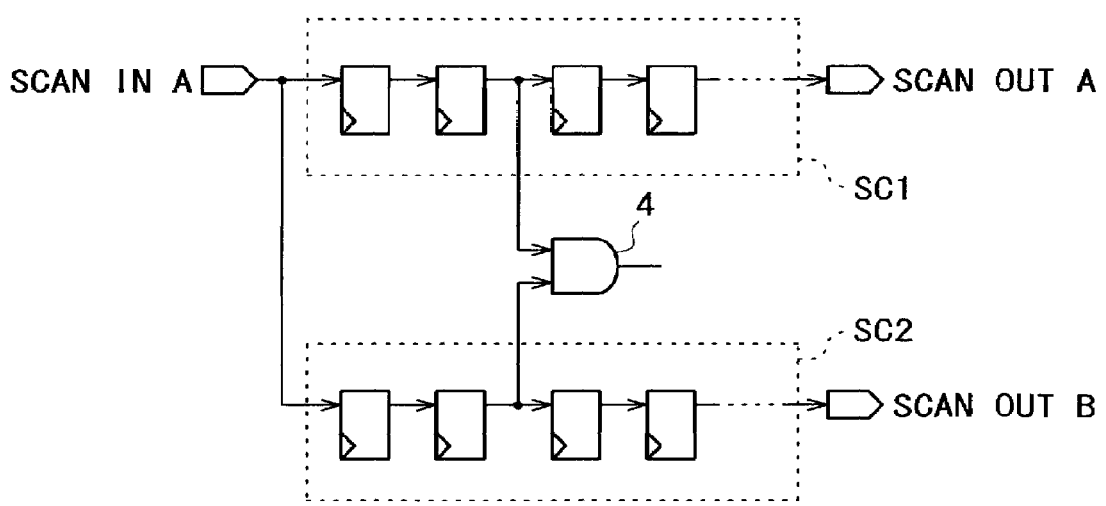
FIG. 5 is a connection diagram for explaining how input terminals are used in common in a plurality of scan chain circuits.

In the case where a test pattern is inputted in common to the scan chain circuits, as shown in FIG. 4 for comparison with FIG. 3, there may exist some difficulty in confirming the operation with regard to the logic circuit where the operation is confirmable in the case of inputting test patterns respectively to the individual scan path circuits. In the examples of FIGS. 3 and 4, input terminals of an AND gate 4 are connected to the same-stage portions of the two scan chain circuits SC1 and SC2. In this case, if a test pattern is inputted in common, it becomes difficult to set different logic values at the two inputs of the AND gate 4, eventually causing difficulty in conforming the operation of the AND gate 4.

Therefore, this embodiment is so contrived that, after confirmation of the operation by selecting the contacts B, the control signal is switched to select the contacts C, thereby switching the inputs of the scan path circuits connected in common (FIG. 2). More specifically, the inputs are so switched that the scan chain circuits SC[0]-SC[31], which belong to the same group formed by the first grouping through the contacts B, belong to a different group formed by the second grouping through the contacts C. And, in this state, a test pattern is supplied in common to each group, and the operation is confirmed in the same manner as that through the contacts B.

Thus, in the scan path circuit 1, the operation can be confirmed even in any region where confirmation of the operation is difficult by the supply of common test patterns, as explained in connection with FIGS. 3 and 4. Consequently, the fault detection rate can be enhanced to ensure exact confirmation of the operation corresponding thereto.

Accordingly, in confirming the operation through selection of the contacts C also, the operation is confirmed by the use of 8 scan-in terminals with regard to the 32 scan chain circuits SC[0]-SC[31], hence achieving an exact test of the logic circuit in a short required time by the structure simplified correspondingly thereto. Further, the capacity of a memory incorporated in the tester can be reduced, and, therefore, confirmation of the operation can be carried out by using the tester of the simplified structure.

Due to such configuration, it becomes possible in the scan path circuit 1 to realize an exact test of the logic circuit with enhanced certainty.

Upon detection of any fault by the check mentioned above, the fault region is specified in an analysis of the cause and so forth, wherein the 32 scan chain circuits SC[0]-SC[31] are connected in series through selection of the contacts A, then a test pattern is inputted thereto successively via the first input/output terminal SI[0], and the response obtained from the last-stage scan chain circuit SC[31] is confirmed via the last input/output terminal SI[31], hence achieving confirmation of the fault with certainty. In this case, the process of data compression in the multiple input signature register 2 is not performed.

When a tester adapted for a multiplicity of scan chains is usable, a test pattern can be inputted to the scan chain circuits SC[0]-SC[31] respectively via the input/output terminals SI[0]-SI[31] by selecting contacts C. And, the responses obtained from the scan chain circuits SC[0]-SC[31] can be monitored via the input/output terminals SI[0]-SI[31] to realize exact confirmation of the fault.

(1-3) Effects of First Embodiment

According to the above structure, the plural scan chain circuits are so connected as to use the input terminals in common, and such common connection is switched to ensure an exact test of the logic circuit in a short required time by the simplified structure.

In this case, an increase in the number of terminals can be prevented by common use of the input and output terminals.

(2) Second Embodiment

Figure 6:
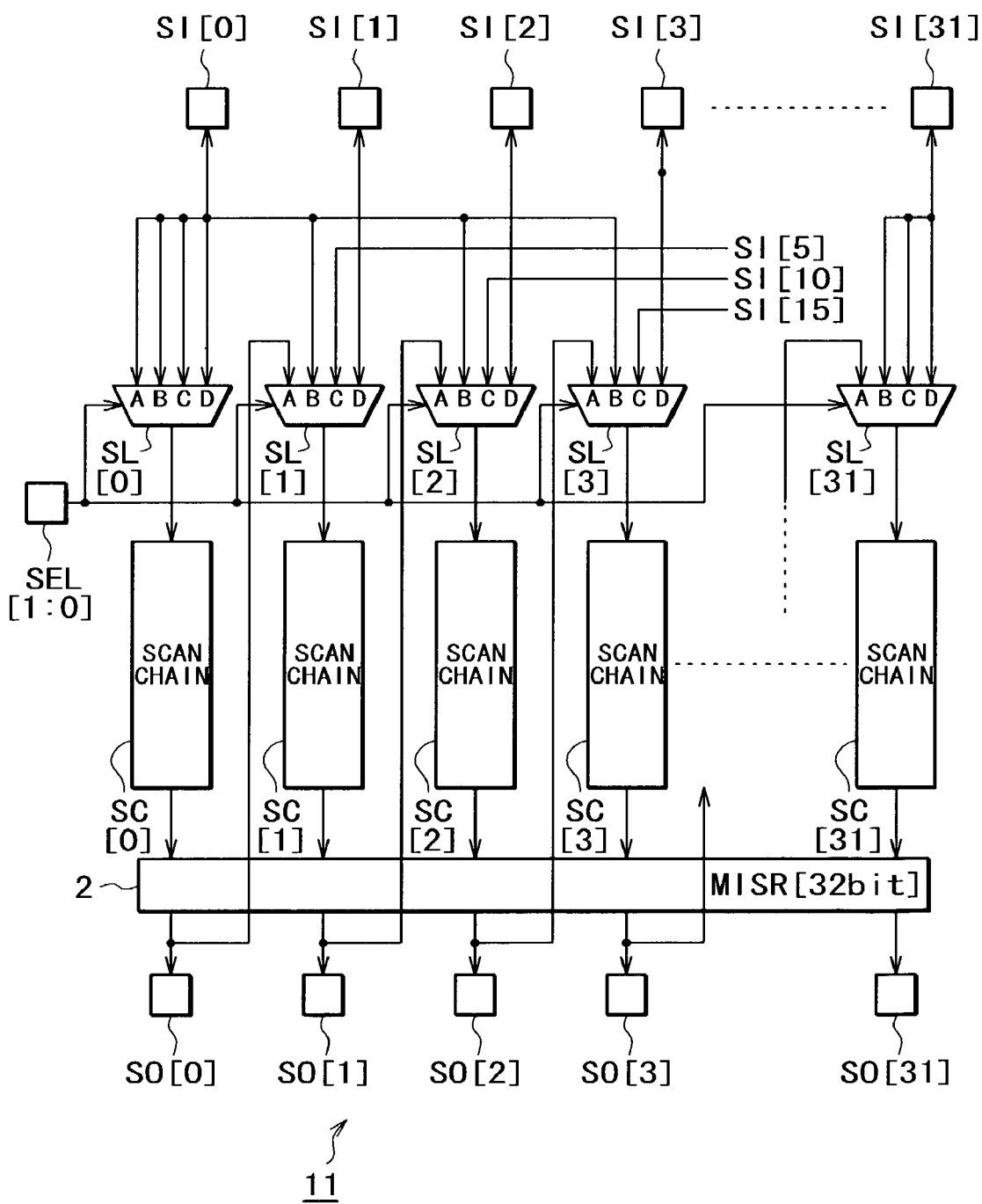
FIG. 6 is a connection diagram of a scan path circuit represented by a second embodiment of the present invention.

FIG. 6 is a connection diagram showing a scan path circuit applied to an integrated circuit that is represented by a second embodiment of the present invention. In the structure of this scan path circuit 11, any component parts corresponding to those in the aforementioned scan path circuit 1 of FIG. 1 are denoted by the same reference numerals or symbols, and a repeated explanation thereof is omitted.

In the scan path circuit 11, exclusive output terminals SO[0]-SO[31] are provided for a multiple input signature register 2, and buffer circuits corresponding thereto are omitted here.

Also, by outputting the responses from such exclusive terminals, the same effects are attainable as in the first embodiment.

(3) Other Embodiments

The embodiments described above are concerned with an exemplary case of grouping the entire scan path circuits respectively. However, it is to be understood that the present invention is not limited to such example alone, and only some partial scan chain circuits may be grouped as well.

In the foregoing embodiments, the scan chain circuits are so grouped that those belonging to the same group formed by the first grouping belong to a different group formed by the second grouping. However, the present invention is not limited to such example alone, and some partial scan chain circuits may belong to the same group formed by both first and second groupings. The essential point resides in that a test pattern is supplied in common to the first and second scan chain circuits in the first operation mode, and the test pattern is supplied in common to the first and third scan chain circuits in the second operation mode, so that any region where confirmation of the operation is difficult can be confirmed in either operation mode.

In any of the above embodiments, input terminals are provided in each scan chain circuit, and portions thereof are used in common depending on the operation mode. However, the present invention is not limited to such example alone, and input terminals may be provided only for common use.

The present invention is not limited to the details of the above described preferred embodiments. The scope of the invention is defined by the appended claims, and all changes and modifications as fall within the equivalence of the scope of the claims are therefore to be embraced by the invention.

What is claimed is:

1. A scan path circuit having a plurality of scan chain circuits, comprising:

a data compression circuit for data-compressing the outputs of said scan chain circuits and delivering the compressed outputs; and a selection circuit for switching the inputs of said scan chain circuits;

wherein said selection circuit switches an operation mode selectively in accordance with a predetermined control signal in such a manner that, in a first operation mode, an input signal obtained from a predetermined input terminal is delivered to the first and second scan chain circuits, and in a second operation mode, the input signal is delivered to the first and third scan chain circuits.

2. A scan path circuit having a plurality of scan chain circuits, comprising:

a data compression circuit for data-compressing the outputs of said scan chain circuits and delivering the compressed outputs; and a selection circuit for switching the inputs of said scan chain circuits;

wherein said selection circuit switches an operation mode selectively in accordance with a predetermined control signal in such a manner that, in a first operation mode, input terminals are connected to the scan chain circuits respectively for use in common in the scan chain circuits in each group formed by a first grouping, and in a second operation mode, the input terminals are connected to the scan chain circuits respectively for use in common in the scan chain circuits in each group formed by a second grouping; said plurality of scan chain circuits being so set that those belonging to the same group formed by the first grouping belong to a different group formed by the second grouping.

3. The scan path circuit according to claim 2, wherein said input terminals are used as output terminals of said data compression circuit.

4. An integrated circuit having a plurality of scan chain circuits, comprising:

a data compression circuit for data-compressing the outputs of said scan chain circuits and delivering the compressed outputs; and a selection circuit for switching the inputs of said scan chain circuits;

wherein said selection circuit switches an operation mode selectively in accordance with a predetermined control signal in such a manner that, in a first operation mode, an input signal obtained from a predetermined input terminal is delivered to the first and second scan chain circuits, and in a second operation mode, the input signal is delivered to the first and third scan chain circuits.

5. An integrated circuit having a plurality of scan chain circuits, comprising:

a data compression circuit for data-compressing the outputs of said scan chain circuits and delivering the compressed outputs; and a selection circuit for switching the inputs of said scan chain circuits;

wherein said selection circuit switches an operation mode selectively in accordance with a predetermined control signal in such a manner that, in a first operation mode, input terminals are connected to the scan chain circuits respectively for use in common in the scan chain circuits in each group formed by a first grouping, and in a second operation mode, the input terminals are connected to the scan chain circuits respectively for use in common in the scan chain circuits in each group formed by a second grouping; said plurality of scan chain circuits being so set that those belonging to the same group formed by the first grouping belong to a different group formed by the second grouping.

6. A method of checking an integrated circuit having a plurality of scan chain circuits, comprising the steps of:
switching the inputs of said scan chain circuits by switching an operation mode by means of a selection circuit;
delivering, in a first operation mode, an input signal obtained from a predetermined input terminal to the first and second scan chain circuits and
delivering, in a second operation mode, said input signal to the first and third scan chain circuits.

7. A method of checking an integrated circuit having a plurality of scan chain circuits, comprising the steps of:
switching the inputs of said scan chain circuits by switching an operation mode by means of a selection circuit;
setting said scan chain circuits in such a manner that those belonging to the same group formed by a first grouping belong to a different group formed by a second grouping;
connecting, in a first operation mode, the input terminals respectively to the scan chain circuits of each group to use the input terminals in common in the scan chain circuits of each group formed by the first grouping; and
connecting, in a second operation mode, the input terminals respectively to the scan chain circuits of each group for use in common with the scan chain circuits of each group formed by the second grouping.

* * * * *